(12) United States Patent
Gelbart

(10) Patent No.: US 6,387,597 B1
(45) Date of Patent: May 14, 2002

(54) METHOD FOR EXPOSING FEATURES ON NON-PLANAR RESISTS

(75) Inventor: Daniel Gelbart, Burnaby (CA)

(73) Assignee: Creo Srl, Holetown (BB)

( * ) Notice: Subject to any disclaimer, the term of this patent is extended or adjusted under 35 U.S.C. 154(b) by 70 days.

(21) Appl. No.: 09/654,042

(22) Filed: Sep. 1, 2000

Related U.S. Application Data

(63) Continuation-in-part of application No. 09/093,854, filed on Jun. 5, 1998, now Pat. No. 6,136,509.

(51) Int. Cl.[7] .................................................. G03C 5/00
(52) U.S. Cl. ...................... 430/311; 430/322; 430/328; 430/330; 430/394; 430/397; 430/945
(58) Field of Search ................................ 430/311, 330, 430/394, 397, 945, 964, 270.1, 328, 322

(56) References Cited

U.S. PATENT DOCUMENTS

| | | |
|---|---|---|
| 4,796,038 A | 1/1989 | Allen et al. |
| 5,001,038 A | 3/1991 | Dorinski et al. |
| 5,164,742 A | 11/1992 | Baek et al. .................... 346/76 |
| 5,182,188 A | 1/1993 | Cole et al. ................... 430/323 |
| 5,208,818 A | 5/1993 | Gelbart et al. ................. 372/30 |
| 5,229,872 A | 7/1993 | Mumola ........................ 359/40 |
| 5,296,891 A | 3/1994 | Vogt et al. ..................... 355/67 |
| 5,298,761 A | 3/1994 | Aoki et al. |
| 5,311,360 A | 5/1994 | Bloom et al. ................ 359/572 |
| 5,314,785 A | 5/1994 | Vogel et al. ................. 430/269 |
| 5,328,811 A | 7/1994 | Brestel ........................ 430/325 |
| 5,340,699 A | 8/1994 | Haley et al. ................. 430/302 |
| 5,372,907 A | 12/1994 | Haley et al. ................. 430/157 |
| 5,372,915 A | 12/1994 | Haley et al. ................. 430/302 |
| 5,450,099 A | 9/1995 | Stephenson et al. ........ 347/200 |
| 5,461,455 A | 10/1995 | Coteus et al. |
| 5,466,557 A | 11/1995 | Haley et al. ................. 430/278 |
| 5,512,418 A | 4/1996 | Ma .......................... 430/271.1 |
| 5,515,848 A | 5/1996 | Corbett, III et al. ......... 128/642 |
| 5,641,608 A | 6/1997 | Grunwald et al. ........... 430/302 |
| 5,739,898 A | 4/1998 | Ozawa et al. |
| 5,742,362 A | 4/1998 | Chikamichi |
| 5,777,724 A | 7/1998 | Suzuki |
| 5,795,686 A | 8/1998 | Takizawa et al. |
| 5,847,812 A | 12/1998 | Ooki et al. |
| 5,851,707 A | 12/1998 | Shibuya et al. |
| 5,958,647 A | 9/1999 | Morgan ..................... 430/270.1 |

FOREIGN PATENT DOCUMENTS

EP 0557138 A2 8/1993

OTHER PUBLICATIONS

Ooki et al. Experimental Study on Non–linear Multiple Exposure Method. SPIE vol. 3051, pp. 85–93 [date unknown].

Neisser et al. Simulation and Experimental Evaluation of Double Exposure Techniques. SPIE vol. 3334, pp. 372–377. [date unknown].

Creo, *Trendsetter Data Sheet* (Aug. 1997).

Creo, *Difine 4LF Thermoresist Data Sheet* (May, 1998).

*Primary Examiner*—Christopher G. Young
(74) *Attorney, Agent, or Firm*—Oyen Wiggs Green & Mutala

(57) ABSTRACT

A method for imaging a non-planar resist uses a non-integrating resist. The resist may be a thermoresist which changes from an unexposed state to an exposed state upon heating to a threshold temperature. The method involves using a variable focus optical system and making a plurality of exposures at different focus settings. The duration and intensity of the exposures is selected so that areas on the resist corresponding to in-focus features are heated to temperatures in excess of the threshold temperature and become exposed whereas areas on the resist corresponding to out-of-focus features are heated to temperatures which are insufficient to expose the resist.

21 Claims, 5 Drawing Sheets

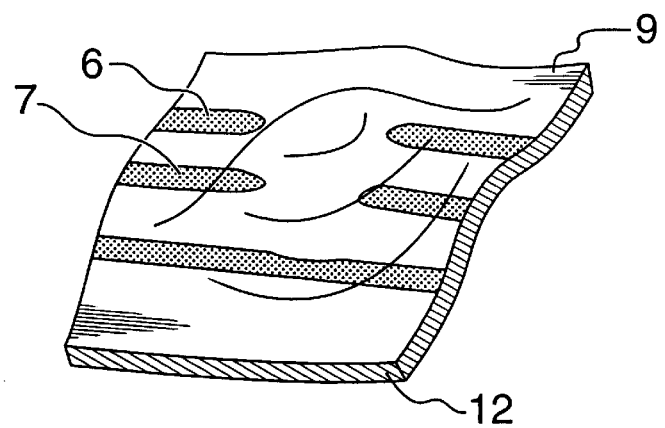
FIG. 5-a
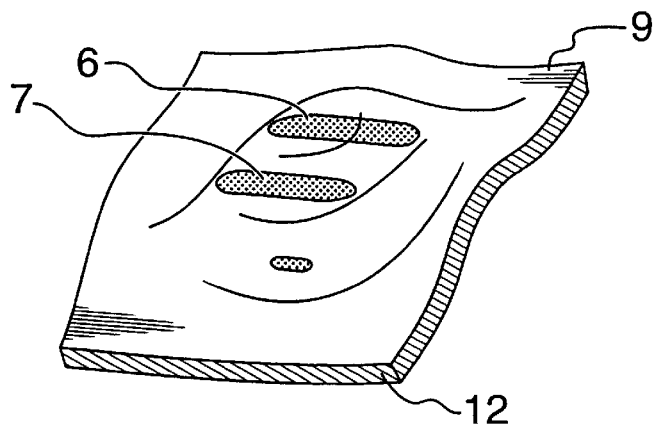
FIG. 5-b
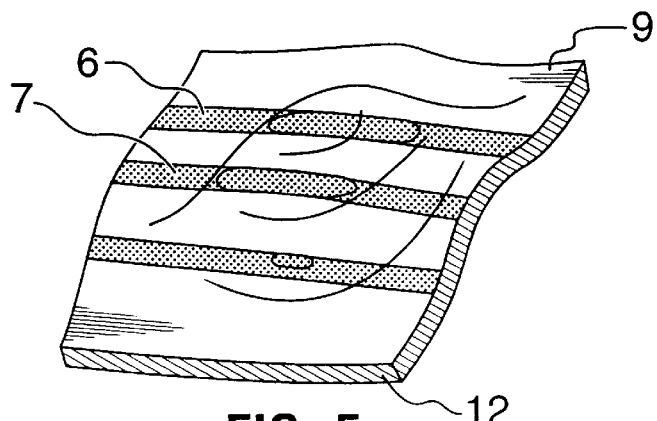
FIG. 5-c

METHOD FOR EXPOSING FEATURES ON NON-PLANAR RESISTS

CROSS REFERENCE TO RELATED APPLICATIONS

This application is a continuation-in-part of application Ser. No. 09/093,854 filed Jun. 5, 1998 now U.S. Pat. No. 6,136,509 and entitled METHOD OF EXPOSING THERMORESIST. The subject matter of this application is related to the subject matter of co-pending and commonly owned application Ser. No. 09/110,378 entitled HIGH RESOLUTION OPTICAL STEPPER.

FIELD OF THE INVENTION

This invention relates to imaging of etch resistant layers also known as "resists". Resists exposed according to the invention may be used to fabricate high resolution patterns by etching or deposition. The invention may be applied to the manufacture of integrated circuits, flat panel displays and printed circuit boards, for example.

BACKGROUND OF THE INVENTION

Processes for fabricating high resolution patterns, mainly on planar objects, by selective etching or deposition are well known. In general, a layer to be shaped or patterned, which may be called a substrate, is covered by a protective layer known as a "resist". In general, a resist is used as an imagewise mask for selectively controlling a chemical or physical process. The resist limits the process to follow an image pattern defined by the resist. The term "resist" should be interpreted in this broad sense throughout this disclosure and claims. Most commonly used resists operate by undergoing a change of solubility in a developer when they are exposed.

An image made up of desired shapes is created on the resist usually via photo-imaging. The exposed (or unexposed, if the resist is negative working) parts of the image are removed, normally by using a liquid developer to expose the substrate. The substrate can now be treated, for example by etching through the openings in the resist layer. The treatment is limited to areas of the substrate adjacent the openings. Portions of the substrate which remain covered by the resist are protected from the etching or other treatment.

Etching may be done, for example, by wet chemicals or by dry plasma (a process widely used in the semiconductor industry). Resists are also used in additive processes in which one or more materials are deposited through openings in the resist to add to the substrate. Deposition may be done in a wet process (as in the well known "additive" process for manufacturing printed circuit boards) or in a dry process, such as a vacuum deposition by evaporation or sputtering or CVD. Resists may also be used to permit chemical reactions, such as oxidation, to occur only in selected areas of a substrate which are not covered by the resist.

At the end of the process the remaining resist is normally removed, or "stripped". Historically most resists were photoresists, i.e. activated and imaged by the photonic action of the light. Because of this photonic action most photoresists operate in the UV part of the spectrum, where the photon energy is high. Some resists can be exposed by other types of radiation, such as electron-beams. All photoresists and electron-beam resists share one fundamental property: they respond to the total exposure, not to the momentary illumination.

In optics, exposure is defined as the integral of illumination over time. When a certain exposure is reached, a change occurs in the resist. The change depends upon the exposure but not upon the intensity of light used to achieve that exposure. For example, a photoresist can be exposed by 100 $mW/cm^2$ for 1 sec to yield an exposure of 100 $mJ/cm^2$ (100 mW×1 sec). The same exposure results when the photoresist is exposed by 1000 mW for 0.1 sec with similar results (1000 mW×0.1 sec=100 $mJ/cm^2$). This law, also known as the "reciprocity law", is the basic law governing the exposure of photoresists.

The law of reciprocity requires that photoresists and other integrating resists be exposed with the use of an optical system which provides a high contrast ratio and low stray light. For example, if an exposure system has a leakage, or stray light, of 1% (e.g.: when exposure is "off", the light level does not drop to zero but only drops to 1% of the "on" state) the effect of this stray light may be as large (or larger) than the main exposure. The effects of stray light accumulate over time and are especially significant if the photoresist is exposed for a long time to the "off" state.

An even larger problem is caused when trying to image closely-spaced high resolution features: the point spread function of any practical optical system causes a "spreading" of light from each feature. Stray light from one feature illuminates adjacent features and lowers the resolution. FIG. 1 illustrates this problem. A first feature 1 has a light distribution 1' and a second feature 3 has a light distribution 3'. Exposure curve 2, generated by lens 8 imaging first feature 1, is added to exposure curve 4, generated by imaging second feature 3, to create a curve 5, which is the equivalent exposure. Curve 5 creates distorted images 6 and 7 of features 1 and 3 on photoresist 9 which has a threshold 10. It makes no difference whether exposures 2 and 4 are applied simultaneously or sequentially. The photoresist will add up, or integrate, the exposures.

The problems described above can be compounded if the surface of the resist is not flat. It is known in the art to treat the surfaces of semiconductors in various ways to enhance planarity. This can increase the cost of manufacturing semiconductor devices. FIG. 4 shows the what occurs when a prior art system is used to expose a non-planar substrate 12 coated with a photoresist 9. The deviation from planarity need not be large in order to cause a problem. When making integrated circuits, the depth of focus is typically below 1 micron due to the large numerical aperture of the lenses used. A deviation of 1 micron can be caused by a build-up of lower layers. Today a CMP process (Chemical-Mechanical Polishing) is used to bring the silicon wafer back to planarity. If lens 8 is focused on the substrate 12 at one point, all points higher or lower than the plane of focus will be out of focus causing loss of imaging resolution. For example, narrow lines will widen and merge (or narrow gaps will disappear). It is not possible to correct this problem by repeating the exposure at a different focus setting because, when the same substrate (which obeys the law of reciprocity) is imaged again at a different focus setting, all the exposure which was absorbed but did not reach the threshold will add up with the new exposure and destroy the image.

Recently a different type of resist, known as thermoresist, has been used in the manufacturing of printing plates and printed circuit boards. A thermoresist (also known as a thermal resist or heat-mode resist) changes solubility when a certain temperature, rather than a certain accumulated exposure, has been reached. Such thermoresists are imaged using near infra-red light and therefore are also known as "IR resists". Some exampled of thermoresists are disclosed in U.S. Pat. No. 5,340,699 (Haley); U.S. Pat. No. 5,372,907

(Haley); U.S. Pat. No. 5,372,915 (Haley); U.S. Pat. No. 5,466,557 (Haley); U.S. Pat. No. 5,512,418 (Ma); U.S. Pat. No. 5,641,608 (Grunwald); U.S. Pat. No. 5,182,188 (Cole); U.S. Pat. No. 5,314,785 (Vogel) and U.S. Pat. No. 5,328,811 (Brestel). The thermoresist described by Haley is unusual as the same composition acts as a photoresist, obeying the reciprocity law, when exposed by UV light (at low power densities) but also acts as a thermoresist, responding only to temperature, when heated up by infrared light at high power densities. Thermal resist is also available from Creo Ltd. (Lod Industrial Park, Israel), sold under the trade name "Difine 4LF". All of the above mentioned thermoresists respond to temperature and do not follow the reciprocity law. Such resists may be called "non-integrating". It is not possible to have a practical true thermoresist which follows the reciprocity law. Such a thermoresist would become exposed simply by long exposure to ambient temperature (just as a photoresist can be exposed by a long exposure to low levels of ambient light). While it is possible to shield a photoresist from ambient light it is not possible to shield from ambient temperature. Therefore a practical thermoresist cannot obey the reciprocity law.

Prolonged exposures to ambient temperatures below the threshold temperature has little effect on a thermoresist. Obviously, the threshold temperature needs to be well above the temperatures expected to be encountered in shipping and storage. When the chemical reaction in a thermoresist does not have a sharp threshold temperature, the chemical composition is formulated to keep the reaction rate very low at room temperature. This is not difficult to do, as most chemical reaction rates approximately double every 10 degrees centigrade. Thus the reaction rate in a thermoresist exposed at 350 degrees centigrade can be a billion times faster than at 25 degrees. Using lasers it is fairly easy to raise the temperature of a thermoresist to over 1000 degrees. Such a thermoresist will appear to have a distinct threshold simply because the reaction rate at lower temperature slows down exponentially. To follow the reciprocity law the reaction rate would have to change in a linear fashion with temperature.

Light valves, also known as multi-channel modulators or spatial light modulators, break up a single light beam into a linear or two-dimensional array of individually addressable spots. Examples of devices which use light valves to expose photoresists are shown in U.S. Pat. No. 5,208,818 (Gelbart) and U.S. Pat. No. 5,296,891 (Vogt). The limiting factor in both these patents is the leakage light from the light valves used. Even if the light valves were ideal, the limited optical resolution of the imaging lens creates a problem equivalent to stray light as previously explained. Multi-beam, also known as multi-spot, scanning is well known in the art and is used to increase writing speed by exposing a plurality of features simultaneously.

There is a need for methods for imaging resists on non-planar substrates. There is a particular need for such methods which can provide high resolution imaging and for such methods which do not require high contrast optical systems.

SUMMARY OF THE INVENTION

This invention takes advantage of the fact that a non-integrating resists, such as thermoresists are not substantially affected by exposure to light or other radiation at levels insufficient to expose the resist. The invention uses this property to image non-planar resists in multiple exposures such that, in each exposure, only "in-focus" parts of the resist are imaged.

One aspect of the invention provides a method for imagewise exposing a non-planar resist layer. The method comprises providing a variable focus optical system and a non-planar, layer of a non-integrating resist on a substrate. The resist may be a thermoresist. The method illuminates selected areas on a surface of the resist layer a first time with the optical system at a first focus setting and thereby causes parts of the resist which are within the selected areas on the substrate and are at a first elevation to be converted from an unexposed state to an exposed state. The resist in the selected areas at a second elevation where the image is not in focus are not converted to the exposed state. The method also illuminates the selected areas on the surface of the resist layer a second time with the optical system at a second focus setting and thereby causes parts of the resist which are within the selected areas on the substrate and are at the second elevation to be converted from the unexposed state to the exposed state.

In preferred embodiments, there is a delay which is longer than a thermal time constant of the resist layer between illuminating the surface the first and second times.

Even when a thermoresist is used, the illumination can be provided at ultraviolet wavelengths. This permits high resolution imaging of the resist. The optical system may, for example, comprise an ultraviolet laser light source.

In preferred embodiments the surface of the resist is illuminated a plurality of times with the optical system at the first focus setting. A different set of selected areas is exposed in each of the plurality of times. For example, in some embodiments an image to be exposed on the resist layer comprises a plurality of pixels arranged in a grid comprising a plurality of rows and a plurality of columns. An image to be exposed on the resist comprises a selected set of the pixels. Illuminating the surface of the resist the first time comprises separately illuminating two or more groups of the selected pixels such that in the groups of the selected pixels no two pixels are in adjacent rows and no two pixels are in adjacent columns. This prevents stray light from one pixel from interfering with the proper exposure of adjacent pixels.

Another aspect of the invention comprises a method for imagewise exposing a non-planar resist layer. The method comprises providing a variable focus optical system and a non-planar, layer of a non-integrating thermoresist on a substrate, the thermoresist changing from an unexposed state to an exposed state upon heating to a threshold temperature; focusing the optical system to generate an in-focus image of a set of features in a first plane of focus of the optical system; illuminating the set of features on a surface of the resist layer a first time for a duration sufficient to heat the illuminated portions of the resist which are in the first plane of focus to a temperature in excess of the threshold temperature at an intensity such that illuminated portions of the resist which are not in the first plane of focus are not heated to the threshold temperature; focusing the optical system to generate an in-focus image of a set of features in a second plane of focus of the optical system; and, illuminating the set of features on a surface of the resist layer a second time for a duration sufficient to heat the illuminated portions of the resist which are in the second plane of focus to a temperature in excess of the threshold temperature at an intensity such that illuminated portions of the resist which are not in the second plane of focus are not heated to the threshold temperature.

The methods of the invention have particular application in the fields of manufacturing of integrated circuits, circuit boards and displays. Further features and advantages of the invention are described below.

BRIEF DESCRIPTION OF THE DRAWINGS

In drawings which illustrate non-limiting embodiments of the invention:

FIG. 5-a is an isometric view of a non-planar thermoresist layer after being exposed at a first focus setting;

FIG. 5-b is an isometric view of a non-planar thermoresist layer when exposed at a second focus setting different from the first focus setting; and, FIG. 5-c is an isometric view of a non-planar thermoresist layer when exposed by two passes, one at the focus setting of FIG. 5-a and a second at the focus setting of FIG. 5-b.

DETAILED DESCRIPTION OF THE PREFERRED EMBODIMENT

This invention involves the use of a non-integrating resist, such as a thermoresist having a threshold temperature. The resist is scanned multiple times to create an image. Because the resist is non-integrating there is little interaction between the subsequent exposures.

Figure 3:
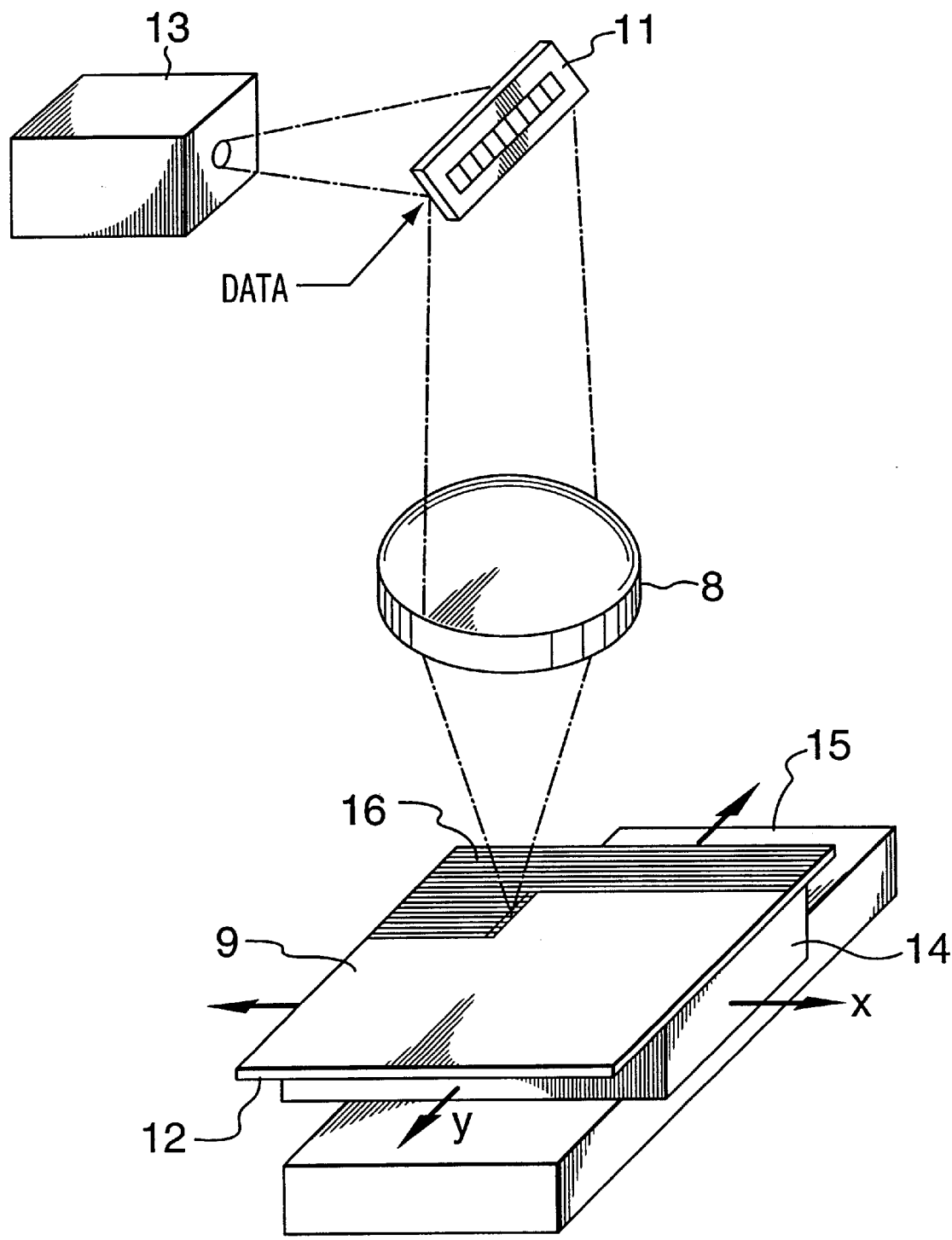
FIG. 3 is an isometric view of a thermoresist exposure apparatus according to the invention.
Figure 4:
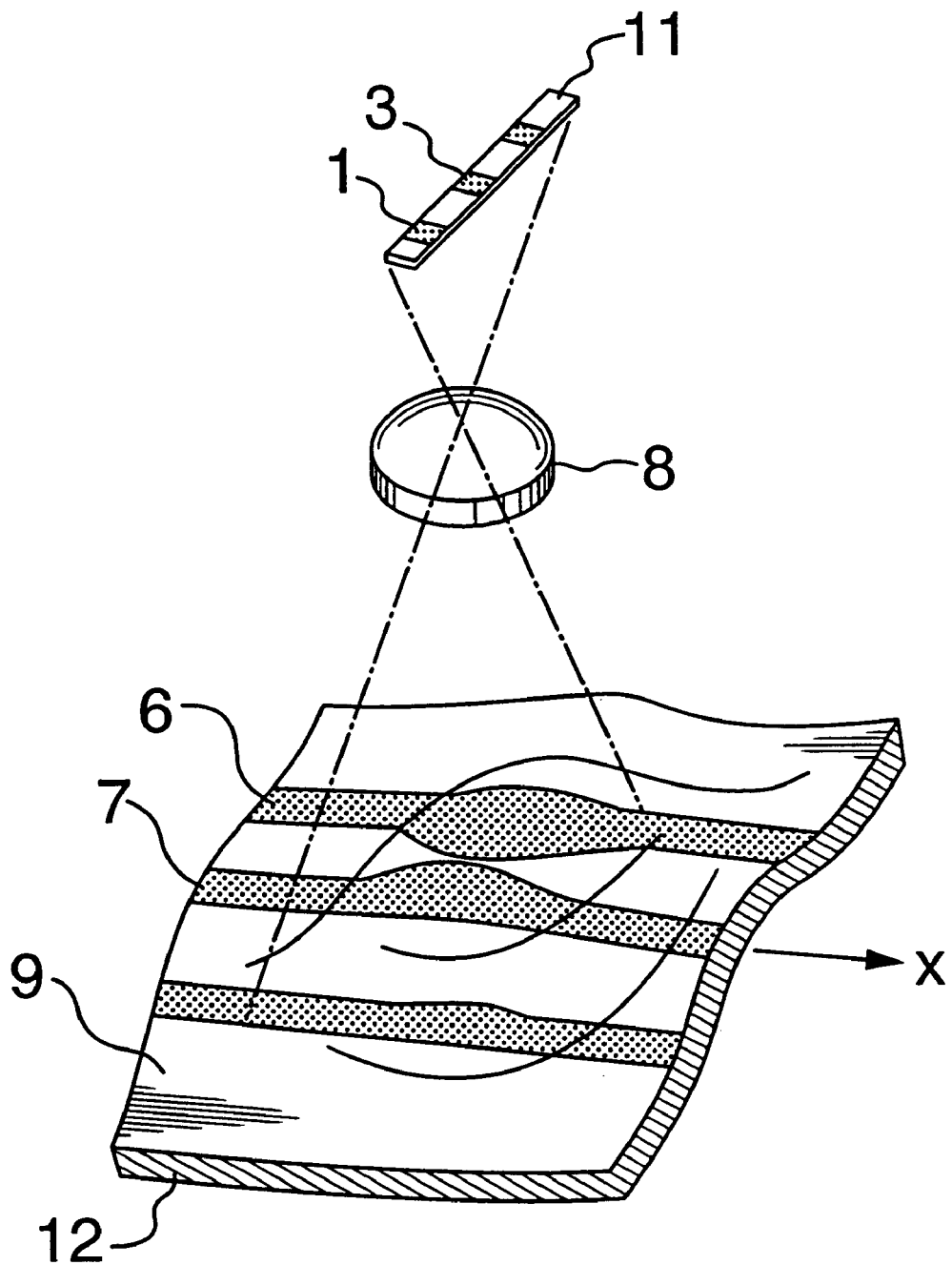
FIG. 4 is an isometric view of a non-planar photoresist on a substrate when exposed by prior art methods.

FIG. 3 shows apparatus of a type which may be used for implementing the invention. The apparatus includes a light source, such as a laser 13 which illuminates a linear light valve 11. Light valve 11 is imaged by way of an optical system 8 (although optical system 8 is represented as a single lens, optical system 8 may comprise any suitable combination of optical elements) onto a substrate 12 covered with a thin layer of thermoresist 9.

Relative motion is created between the image of light valve 11 and substrate 12 in two dimensions. By way of example, such a motion can be created by mounting substrate 12 on a two dimensional mechanical stage comprising orthogonal slides 14 and 15. Slide 14 moves the substrate in the X direction and slide 15 moves the substrate in the Y direction. Further details of such an apparatus are given in commonly assigned U.S. Pat. No. 5,208,818 which is hereby incorporated by reference in this disclosure. In the alternative, if substrate 12 is flexible it may be wrapped on the outside of a cylinder and scanned in the same way that most laser plotters operate. This is possible where the substrate is a thin flexible printed circuit board. In the further alternative, the substrate may remain fixed while the image is moved across a surface of the substrate.

The result of the scanning is that the surface area of substrate 12 is covered by contiguous or overlapping stripes 16. For overlapping stripes (i.e. multiple exposures of each area) the methods of U.S. Pat. No. 5,208,818 are preferred. The velocity in the fast scan direction can be sinusoidal or any other velocity profile.

Thermoresists are typically exposed using visible or IR radiation. However, in the preferred embodiment of the invention, light source 13 is a UV laser (for example, a frequency-quadrupled YAG laser operating at 266 nm). This is desired in order to combine the higher resolution of deep UV light with the increased resolution provided by the invention. A thermoresist exposed by UV light still acts as a thermoresist, i.e. does not obey the law of reciprocity. The UV light is absorbed in the thermoresist where it is used as a source of heat. If the thermoresist becomes heated to a temperature in excess of its threshold temperature then it changes from its unexposed state to its exposed state.

For the manufacturing of devices for which a lower resolution is acceptable, such as flat panel displays and printed circuit boards, laser 13 can be an IR laser or a visible light laser, as the required resolution is lower. A laser diode operating at 830 nm, a YAG laser operating at No. 1064 nm or frequency doubled YAG operating at 532 nm can be used. While no details of the light valve are given, the most suitable light valves for this invention are linear micromachined light valves, as those available from Silicon Light Machines Inc. of Sunnyvale, Calif.

Figure 2:
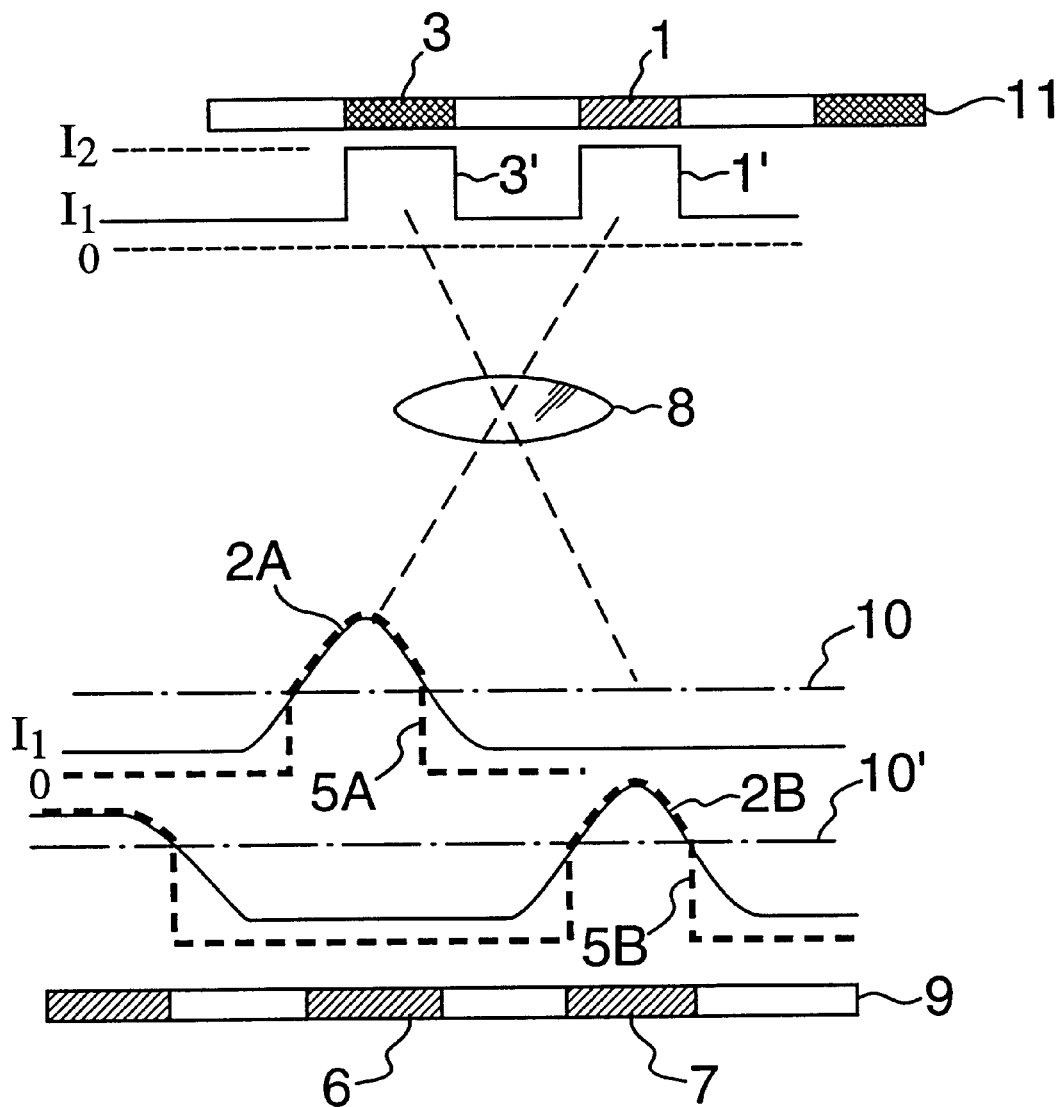
FIG. 2 shows schematically the increased resolution possible by multiple exposures using a thermoresist according to the invention.

As shown in FIG. 2, light valve 11 has features 1 and 3 turned on (a feature can be a single pixel or may comprise multiple pixels). The illumination profile created by these features at the light valve is shown by 1' and 3'. Note that the illumination level changes from $I_1$ to $I_2$ when a feature is turned on, but that $I_1$, the illumination delivered when a feature is turned off, is not zero. $I_1$ may be called the leakage light of the light valve. The ratio $I_2/I_1$, is sometimes referred to as "on/off ratio" or "contrast ratio" of the light valve. It is usually difficult to properly expose a photoresist with a light valve which has a contrast ratio of less than about 100:0 due to the accumulation of leakage light which is integrated by the photoresist.

When a non-integrating resist such as a thermoresist is used according to this invention the effect of leakage light can be eliminated as any light level insufficient to heat the resist to a temperature in excess of its threshold temperature will not have any lasting effect on the thermoresist. Such light will be converted to heat which dissipates rapidly. Even better performance can be achieved by exposing the thermoresist with multiple passes.

Figure 1:
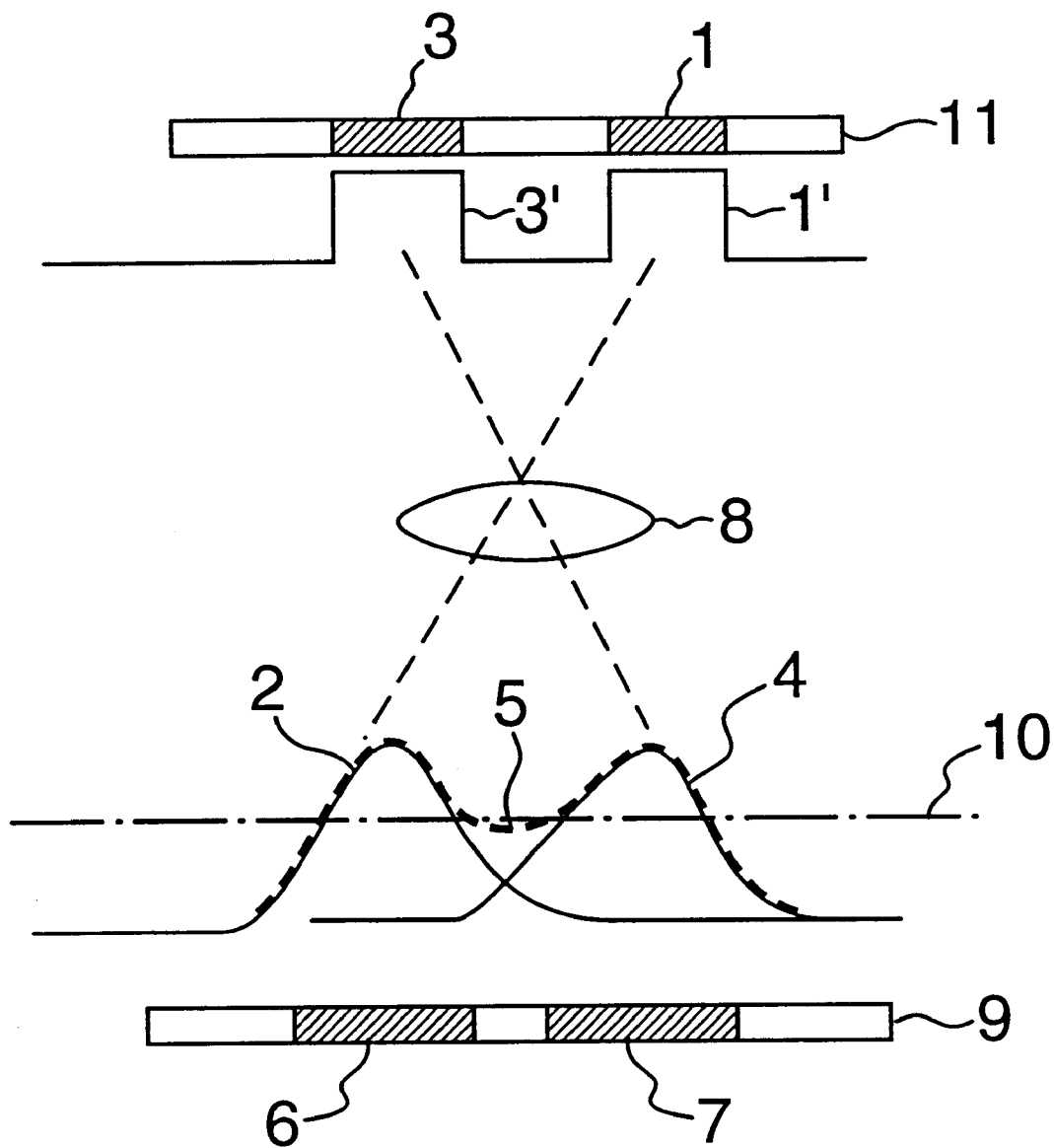
FIG. 1 shows schematically the loss of resolution in prior art imaging caused by the light-integrating nature of photoresists.

By the way of example, consider the case illustrated in FIG. 2 in which it is desired to expose two closely spaced features, feature 1 and feature 2 on a thermoresist. Only feature 1 is enabled on a first pass over the area of the substrate on which the features will be imaged. During the first pass, feature 1 is imaged on thermoresist 9 by lens 8. The radiation in the image of feature 1 is absorbed in the resist and forms a temperature profile 2 in the resist. All points of profile 2 exceeding the threshold temperature 10 will change the solubility of resist 9 (making it more soluble if resist 9 is a positive resist and less soluble if resist 9 is a negative resist). The use of a thermoresist 9 having a threshold temperature 10 changes profile 2 into an effective profile 5A which is much steeper than profile 5 of FIG. 1 and shows no effect of stray light $I_1$.

All points of the resist at which the temperature of the resist remains below threshold 10 are not permanently affected by the first exposure pass. After the first pass, heat from this first exposure is allowed to dissipate. One or more subsequent exposures can be then made which are completely independent of the first exposure.

Feature 3 is imaged in a second pass. The second pass is sufficiently delayed after the first pass (in which feature 1 is imaged) so that stray heat from the first pass has substantially dissipated. Since most thermoresist layers are 1–2 microns thick, their thermal time constants are on the order of 1 microsecond. In order to allow the stray heat to dissipate, a delay of a few time constants (typically 2 to 5 microseconds) is used before the second pass. The second pass generates temperature profile 4 in the thermoresist.

Effective temperature profile 5B forms a mark 7 on the thermoresist. The shapes of profile 5B and the resulting mark 7 are not affected by mark 6, formed in the previous exposure. Any resolution limitation of lens 8 which may cause stray heat has no effect as now only feature 3 is enabled and any stray heat from feature 1 which may have reached the resist in the location of mark 7 has dissipated. This allows marks 6 and 7 to be made to high resolutions immune to leakage light from light valve 11. The resolution limits of lens 8 are also improved. If curves 2 and 4 do not exceed thresholds 10 and 10' no marks are formed, even after repeated exposures. Threshold 10' is identical to threshold 10, as the two passes are done at different times but on the same area of thermoresist 9.

By dividing up an image into multiple sets of features the spatial resolution (i.e. the number of features per unit area) of each exposure can be reduced while the overall resolution with which the final image is created can be increased. For example, an image can be divided up into small pixels. The pixels are small enough that the desired image can be created by exposing or not exposing each pixel. The pixels can be numbered. Each pixel can be imaged as a separate feature. In preferred embodiments of the invention, adjacent pixels are not imaged at the same time. Odd-numbered features (i.e. every other pixel) can be exposed in one pass and even numbered features in another pass, since there is no interaction between the sequential exposures. As the substrate is two-dimensional, it is generally desirable to separately expose features which are close to one another in either dimension. This takes four or more exposures. For example, in a case where all features are arranged in a two dimensional array of pixels having a number of consecutively numbered rows and a number of consecutively numbered columns, on a first exposure, pixels at intersections of even rows and even columns could be imaged; on a second exposure, pixels at the intersections of even rows and odd columns could be imaged; on a third exposure, pixels at intersections of odd rows and even columns could be imaged; and, on a fourth exposure, pixels at intersections of odd rows and odd columns could be imaged.

Since thermoresists do not follow the law of reciprocity the durations of the exposures (exposure times) are more critical than is the case when imaging photonic materials (a low exposure for a long time will have no effect). The required exposure time can be reduced by increasing the power density of the exposing radiation (in order to deposit enough energy during the exposure to heat the thermoresist to a temperature in excess of the threshold temperature). The power density of the exposing radiation should be kept below a power density at which the thermoresist will be ablated. Ablation typically happens at power densities of about 1000 kW/cm$^2$ or higher. Ablation is normally undesirable as it creates debris (unless the thermoresist is of a type designed to be used in ablation).

The upper limit to the exposure time is determined by the rate at which heat can escape from the thermoresist into the substrate (as characterized by the thermal time constant of the thermoresist). For most thermoresists the upper limit of exposure time is about 100 microseconds (for a 1 micron layer) and the corresponding power density is below 100 kW/cm$^2$.

While existing thermoresists have an absorber dye with a maximum absorbency in the IR, no new dyes are needed for operation in UV as most of these dyes, as well as the polymers used in making the thermoresists, absorb strongly in the UV. This is particularly true for operation at 266 nm, where most materials absorb strongly. Thus the same thermoresist formulation used in the IR can be used at 266 nm and other UV wavelengths.

The invention can also be used to image non-planar resists with an optical system which has a shallow depth of field as shown in FIGS. 5-a through 5-c. The non-planar thermoresist is imaged multiple times, each image at a different focus setting. In FIG. 5-a the resist is heated to a temperature in excess of its threshold temperature only in its portions which correspond to parts of lines 6 and 7 which are in focus. Only these portions of the resist change from their unexposed state to their exposed state. Portions of resist 9 on lines 6 and 7 which are out of the plane of focus of the optical system 8 did not reach the threshold temperature. Resist 9 is not exposed in these out-of-focus areas. The heat from the first exposure dissipates in a few thermal time constants of the resist.

FIG. 5-b shows the results of imaging the same resist at a different focus setting. Only the sections of features 6 and 7 that are in focus at the second focus setting are imaged. FIG. 5-c shows the imaged substrate of FIG. 5-a, re-imaged at the focus setting of FIG. 5-b. All the features (parts of lines 6 and 7) which were out-of-focus in the first exposure are in focus during the second exposure, completing the image of lines 6, 7. More than two exposures may be required if the deviations from planarity are large. As long as the change in focus between the subsequent exposures is less than the depth-of-focus of optical system 8 the complete surface of substrate 12 can be imaged.

This method can be combined with the previously described method of illuminating different features on subsequent exposures. For example, if features 1 and 3 in FIG. 2 need to be imaged at maximum resolution on a non-planar substrate, four exposures may be used as follows:

First exposure: Feature 1 at first focus
Second exposure: Feature 3 at first focus
Third exposure: Feature 1 at second focus
Fourth exposure: Feature 3 at second focus.

The sequence in which these exposures are made is not important.

In general, in practicing the invention one or more exposures may be made at each of two or more focus settings. If multiple exposures are used at a given focus setting then it is generally preferable that closely adjacent features be imaged in different ones of the multiple exposures. Where the features of an image are pixels, which may be either turned "on" or "off" during an exposure, multiple exposures may be used so that, within any single exposure, no two pixels are both "on" unless they are separated by n intervening pixels where n is an integer. Sufficient time is allowed to elapse between successive exposures to allow heat from the earlier of the exposures to dissipate.

EXAMPLE

A copper-clad inner layer of a printed circuit board was coated with Difine 4LF thermal resist by dip coating. A pattern of one pixel on/one pixel off was imaged on a Creo Trendsetter operating at 2400 dpi, as well as a 2 pixel on/2 pixel off pattern. Each pixel is about 10.6 microns (1/2400") on a side. After imaging the resist was developed according to the data sheet, using standard developer. The Trendsetter is available from Creo Products Inc. (Vancouver, Canada) and the Difme 4LF thermoresist is available from Creo Ltd. (Lod, Israel). The Trendsetter uses a light valve. The light leakage was set at 5%. Even at this relatively high light leakage, the 2 pixel on/2 off pattern was imaged sharply in a single exposure, far exceeding results achieved with photoresists. The 1 on/1 off pattern was broken up. When the 1 on/1 off pattern was imaged in 2 passes, each pass consisting of 1 on/3 off and passes staggered by 2 pixels (i.e.: odd lines imaged in one pass and even lines imaged in second pass), a good 1 on/1 off pattern was achieved.

As will be apparent to those skilled in the art in the light of the foregoing disclosure, many alterations and modifications are possible in the practice of this invention without departing from the spirit or scope thereof. For example, the methods of the invention are not limited to thermoresists but can be used with any resist which is substantially non-integrating (i.e. does not follow the reciprocity law). Accordingly, the scope of the invention is to be construed in accordance with the substance defined by the following claims.

What is claimed is:

1. A method for imagewise exposing a non-planar resist layer, the method comprising:
    a) providing a variable focus optical system and a non-planar, layer of a non-integrating resist on a substrate;
    b) illuminating selected areas on a surface of the resist layer a first time with the optical system at a first focus setting and thereby causing parts of the resist which are within the selected areas on the substrate and are at a first elevation to be converted from an unexposed state to an exposed state while not converting the resist in the selected areas at a second elevation; and,
    c) illuminating the selected areas on the surface of the resist layer a second time with the optical system at a second focus setting and thereby causing parts of the resist which are within the selected areas on the substrate and are at the second elevation to be converted from the unexposed state to the exposed state.

2. The method of claim 1 wherein the resist layer comprises a thermoresist which is converted to its exposed state upon heating to a temperature in excess of a threshold temperature.

3. The method of claim 2 comprising waiting for a period longer than a thermal time constant of the resist layer between illuminating the surface the first and second times.

4. The method of claim 2 wherein, at elevations within a zone of focus of the optical system, the optical system focuses light from a light source to an intensity sufficient to cause a temperature of the thermoresist to exceed the threshold temperature.

5. The method of claim 4 wherein, at elevations outside of the zone of focus, the light from the light source is defocused and has an intensity insufficient to cause a temperature of the thermoresist to exceed the threshold temperature.

6. The method of claim 1 wherein the optical system comprises a mask which blocks radiation from passing to the substrate except within the selected areas.

7. The method of claim 1 wherein the optical system comprises a laser light source.

8. The method of claim 7 wherein the laser light source comprises an ultraviolet light laser.

9. The method of claim 7 wherein the laser light source comprises an infrared light laser.

10. The method of claim 1 wherein illuminating the substrate the first and second times comprises scanning one or more modulated focused light beams generated by the optical system in two dimensions across the substrate.

11. The method of claim 1 wherein illuminating the substrate the first and second times comprises illuminating the substrate with ultraviolet light.

12. The method of claim 2 wherein illuminating the substrate the first and second times comprises illuminating the substrate with ultraviolet light.

13. The method of claim 1 wherein illuminating the substrate the first and second times comprises illuminating the substrate with infrared light.

14. The method of claim 2 comprising illuminating the surface of the resist a plurality of times with the optical system at the first focus setting, wherein a different set of selected areas is exposed in each of the plurality of times.

15. The method of claim 14 comprising illuminating the surface of the resist a plurality of times with the optical system at the second focus setting, wherein a different set of selected areas is exposed in each of the plurality of times.

16. The method of claim 1 wherein an image to be exposed on the resist layer comprises a plurality of pixels arranged in a grid comprising a plurality of rows and a plurality of columns; an image to be exposed on the resist comprises a selected set of the pixels; and illuminating the surface of the resist the first time comprises separately illuminating two or more groups of the selected pixels such that in the groups of the selected pixels no two pixels are in adjacent rows and no two pixels are in adjacent columns.

17. The method of claim 2 wherein an image to be exposed on the resist layer comprises a plurality of pixels arranged in a grid comprising a plurality of rows and a plurality of columns; an image to be exposed on the resist comprises a selected set of the pixels; and illuminating the surface of the resist the first time comprises separately illuminating two or more groups of the selected pixels such that in the groups of the selected pixels no two pixels are in adjacent rows and no two pixels are in adjacent columns.

18. The method of claim 1 wherein an image to be exposed on the resist layer comprises a plurality of pixels arranged in a grid comprising a plurality of consecutively numbered rows and a plurality of consecutively numbered columns; an image to be exposed on the resist comprises a selected set of the pixels; and illuminating the surface of the resist the first time comprises separately illuminating two or more groups of the selected pixels such that in a first one of the groups the selected pixels are in odd numbered columns and in a second group of the selected pixels the selected pixels are in even-numbered columns.

19. The method of claim 1 wherein illuminating the selected areas of the resist comprises substantially covering a surface area of the resist by scanning an image of a light source across the resist in a plurality of substantially parallel-sided stripes and modulating the scanned image to illuminate the selected areas.

20. A method for imagewise exposing a non-planar resist layer, the method comprising:
    a) providing a variable focus optical system and a non-planar, layer of a non-integrating thermoresist on a substrate, the thermoresist changing from an unexposed state to an exposed state upon heating to a threshold temperature;
    b) focusing the optical system to generate an in-focus image of a set of features in a first plane of focus of the optical system;
    c) illuminating the set of features on a surface of the resist layer a first time for a duration sufficient to heat the illuminated portions of the resist which are in the first plane of focus to a temperature in excess of the threshold temperature at an intensity such that illuminated portions of the resist which are not in the first plane of focus are not heated to the threshold temperature;
    d) focusing the optical system to generate an in-focus image of a set of features in a second plane of focus of the optical system; and,
    e) illuminating the set of features on a surface of the resist layer a second time for a duration sufficient to heat the illuminated portions of the resist which are in the second plane of focus to a temperature in excess of the threshold temperature at an intensity such that illuminated portions of the resist which are not in the second plane of focus are not heated to the threshold temperature.

21. The method of claim 20 comprising waiting for 2 or more thermal time constants of the resist between illuminating the set of features on the resist the first time and illuminating the set of features on the resist the second time.

* * * * *